United States Patent
Lee

(10) Patent No.: US 9,252,361 B2
(45) Date of Patent: Feb. 2, 2016

(54) ELECTRONIC DEVICE AND METHOD FOR FABRICATING THE SAME

(71) Applicant: SK hynix Inc., Icheon-Si (KR)

(72) Inventor: Young-Ju Lee, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 14/461,255

(22) Filed: Aug. 15, 2014

(65) Prior Publication Data

US 2015/0270482 A1    Sep. 24, 2015

(30) Foreign Application Priority Data

Mar. 24, 2014    (KR) .................... 10-2014-0034071

(51) Int. Cl.
*H01L 21/8242* (2006.01)
*H01L 45/00* (2006.01)
*G06F 12/08* (2006.01)
*H01L 27/24* (2006.01)

(52) U.S. Cl.
CPC ........ *H01L 45/1675* (2013.01); *G06F 12/0831* (2013.01); *H01L 27/2463* (2013.01); *H01L 45/12* (2013.01); *H01L 45/1233* (2013.01); *G06F 2212/621* (2013.01)

(58) Field of Classification Search
None
See application file for complete search history.

(56) References Cited

U.S. PATENT DOCUMENTS

| | | | | |
|---|---|---|---|---|
| 8,319,204 | B2 * | 11/2012 | Terao | ............... G11C 13/0004 257/4 |
| 2013/0082231 | A1 * | 4/2013 | Tada | ............... G11C 13/0007 257/4 |
| 2013/0221417 | A1 | 8/2013 | Lee et al. | |

FOREIGN PATENT DOCUMENTS

KR    10-2009-0097361 A    9/2009
KR    10-2013-0028802 A    3/2013

* cited by examiner

*Primary Examiner* — Angel Roman
(74) *Attorney, Agent, or Firm* — Perkins Coie LLP

(57) ABSTRACT

Provided is an electronic device including a semiconductor memory. The semiconductor memory may include: an interlayer dielectric layer formed over a substrate including first and second areas; a first contact plug contacted with the substrate through the interlayer dielectric layer of the second area; an anti-peeling layer formed over the interlayer dielectric layer including the first contact plug; a second contact plug contacted with the substrate through the anti-peeling layer and the interlayer dielectric layer in the first area; and a variable resistance pattern contacted with the second contact plug.

20 Claims, 9 Drawing Sheets

ELECTRONIC DEVICE AND METHOD FOR FABRICATING THE SAME

CROSS-REFERENCE TO RELATED APPLICATIONS

This patent document claims priority of Korean Patent Application No. 10-2014-0034071, entitled "ELECTRONIC DEVICE AND METHOD FOR FABRICATING THE SAME" and filed on Mar. 24, 2014, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on, and research and development for such electronic devices have been conducted. Examples of such semiconductor devices include semiconductor devices which can store data using a characteristic that they are switched between different resistance states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes an electronic device including a semiconductor memory, which is capable of preventing a defect of a variable resistance element and improving the characteristic of the variable resistance element, and a method for fabricating the same.

In one aspect, an electronic device is provided to comprise a semiconductor memory which includes an interlayer dielectric layer formed over a substrate including first and second areas; a first contact plug contacted with the substrate to pass through the interlayer dielectric layer of the second area; an anti-peeling layer formed over the interlayer dielectric layer including the first contact plug; a second contact plug contacted with the substrate through the anti-peeling layer and the interlayer dielectric layer in the first area; and a variable resistance pattern contacted with the second contact plug and above the anti-peeling layer. In one aspect, an electronic device is provided to comprise a semiconductor memory which includes an interlayer dielectric layer formed over a substrate including first and second areas; a first contact plug formed over the substrate to pass through the interlayer dielectric layer of the second area; an anti-peeling layer formed over the interlayer dielectric layer including the first contact plug to cover the first contact plug; a second contact plug formed over the substrate to pass through the anti-peeling layer and the interlayer dielectric layer in the first area; and a variable resistance pattern contacted with and formed over the second contact plug and above the anti-peeling layer.

In some implementations, a portion of the variable resistance pattern is formed over the anti-peeling layer. In some implementations, the anti-peeling layer includes a stacked structure of a passivation layer and an adhesive layer. In some implementations, the adhesive layer is formed around a top end of the second contact plug. In some implementations, the passivation layer includes an insulating material. In some implementations, the adhesive layer includes silicon. In some implementations, a top surface of the second contact plug is higher than a top surface of the first contact plug. In some implementations, the electronic device may further include a conductive line formed over the variable resistance pattern of the first area; and a third contact plug for coupling the conductive line and the variable resistance pattern. In some implementations, the electronic device may further include a third contact plug formed over the variable resistance pattern of the first area; and a conductive line formed over the third contact plug and coupled to the variable resistance pattern through the third contact plug. In some implementations, the electronic device may further include a metal wiring of the second area; and a fourth contact plug for coupling the metal wiring and to the first contact plug.

In some implementations, the electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit is part of the memory unit in the microprocessor.

In some implementations, the electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit is part of the cache memory unit in the processor.

In some implementations, the electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

In some implementations, the electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

In some implementations, the electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit is part of the memory or the buffer memory in the memory system.

In another aspect, a method for fabricating an electronic device is provided. The method may include forming a first interlayer dielectric layer over a substrate including first and second areas; forming a first contact plug to be coupled to the substrate through the first interlayer dielectric layer of the second area; forming an anti-peeling layer over the first interlayer dielectric layer including the first contact plug; forming a second contact plug to be coupled to the substrate through the anti-peeling layer and the first interlayer dielectric layer in the first area; and forming a variable resistance pattern to be contacted with the second contact plug.

In another aspect, a method for fabricating an electronic device is provided. The method may include a semiconductor memory, comprising: forming a first interlayer dielectric layer over a substrate including first and second areas; forming a first contact plug over the substrate to pass through the first interlayer dielectric layer of the second area; forming an anti-peeling layer over the first interlayer dielectric layer including the first contact plug to cover the first contact plug; after forming the anti-peeling layer covering the first contact plug, forming a second contact plug over the substrate to pass through the anti-peeling layer and the first interlayer dielectric layer in the first area; and subsequently forming a variable resistance pattern over the second contact plug and above the anti-peeling layer.

In some implementations, the anti-peeling layer includes a stacked structure of a passivation layer and an adhesive layer. In some implementations, the anti-peeling layer includes nitride, oxide, or silicon. In some implementations, the passivation layer includes an insulating material. In some implementations, the adhesive layer includes silicon. In some implementations, the forming of the second contact plug includes: forming a contact hole to pass through the anti-peeling layer and the first interlayer dielectric layer; burying a conductive material in the contact hole; and patterning the conductive material on the first interlayer dielectric layer. In some implementations, the patterning of the conductive material is performed through an overall etching process or chemical mechanical polishing process. In some implementations, the patterning of the conductive material for forming the second contact plug is performed above the anti-peeling layer in the second area of the substrate so that the first contact plug underneath the anti-peeling layer is insulated the patterning of the conductive material. In some implementations, the forming of the variable resistance pattern includes: forming a variable resistance layer over the anti-peeling layer including the second contact plug; and etching the variable resistance layer so as to form the variable resistance pattern coupled to the second contact plug. In some implementations, the forming of the variable resistance pattern includes: forming a variable resistance layer over the anti-peeling layer including the second contact plug; and etching the variable resistance layer so as to form the variable resistance pattern over the second contact plug while isolating the first contact plug that is covered by the anti-peeling layer from an impact of patterning the variable resistance layer. In some implementations, the adhesive layer is etched in the forming of the variable resistance pattern. In some implementations, the method may further include, after the forming of the variable resistance pattern: forming a second interlayer dielectric layer over the anti-peeling layer so as to fill the space between the variable resistance patterns; forming a third contact plug over the variable resistance pattern to pass through the second interlayer dielectric layer of the first area; forming a fourth contact plug over the first contact plug to pass through the second interlayer dielectric layer and the anti-peeling layer in the second area; and forming a conductive line and a metal wiring to be contacted with the third and fourth contact plugs, respectively.

In another aspect, an electronic device is provided to comprise a semiconductor memory which includes a substrate including a first area and a second area; a first contact plug and a second contact plug formed over the substrate of the second area and the first area, respectively; a variable resistance pattern formed over the second contact plug and in electrical contact with the second contact plug; and an anti-peeling layer formed to extend in both the first and second area to be above the first contact plug and below the variable resistance pattern and includes an opening through which the second contact plug passes through to reach the variable resistance pattern above the anti-peeling layer, wherein the anti-peeling layer isolates the first contact plug from layers formed above the anti-peeling layer and from fabrication processes performed after formation of the anti-peeling layer.

In some implementations, a top surface of the second contact plug is higher than a top surface of the first contact plug. In some implementations, the anti-peeling layer includes nitride, oxide, or silicon. In some implementations, the anti-peeling layer includes a stacked structure of a passivation layer and an adhesive layer.

Those and other aspects of the disclosed technology and their implementations and variations are described in greater detail in the drawings, the description and the claims.

DETAILED DESCRIPTION

Figure 1:
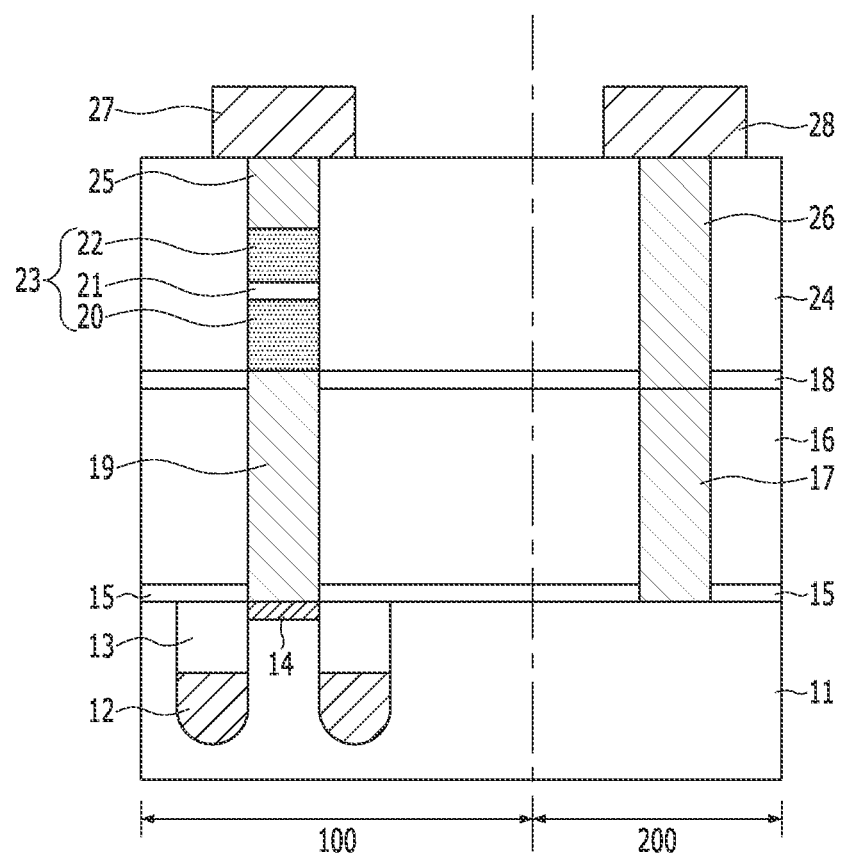
FIG. 1 is a cross-sectional view of a semiconductor device in accordance with one implementation.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Disclosed implementations can be used to provide a semiconductor device which includes an anti-peeling layer to prevent a defect caused by peeling of a variable resistance layer in a peripheral area, and a method for fabricating the same. Since a metal wiring contact for coupling a substrate and a metal wiring in the peripheral area has a large aspect ratio, it is difficult to form the metal wiring contact at a time. Thus, the metal wiring contact may be formed by repeating a contact process. For example, a process for a partial contact in the peripheral area, a process for a variable resistance pattern and a metal wiring in a cell area, and a process for a metal wiring in the peripheral area may be sequentially performed. However, during the process for forming the variable resistance pattern in the cell area, a variable resistance layer may be peeled to cause a defect in the peripheral area or attack the partial contact. In the disclosed implementations, since the anti-peeling layer is additionally formed after the partial contact is formed in the peripheral area, it is possible to effectively reduce defects when forming the variable resistance pattern.

FIG. 1 is a cross-sectional view of a semiconductor device in accordance with a first implementation.

As illustrated in FIG. 1, an isolation layer (not illustrated) may be formed in a semiconductor substrate 11 including first and second areas 100 and 200. The first area 100 may include a cell area which can include at least one memory cell formed by a variable resistance pattern for storing data, and the second area 200 may include a peripheral area which can include driver circuits. Furthermore, a switching element may be formed in the semiconductor substrate 11 of the first area 100 to select a particular unit cell within a plurality of unit cells for performing a reading or writing operation. The switching element may include a gate electrode 12 and a sealing layer 13. Hereafter, the gate electrode 12 serving as a switching element will be referred to as a switching element 12. Between the switching elements 12, a landing plug contact 14 may be formed.

An etch stop layer 15 and a first interlayer dielectric layer 16 may be formed over the semiconductor substrate 11 including the switching elements 12 and the landing plug contact 14. Furthermore, a first contact plug 17 may be formed over the semiconductor substrate 11 of the second area 200. The first contact plug 17 may be coupled to the semiconductor substrate 11 through the first interlayer dielectric layer 16.

Notably, an anti-peeling layer 18 may be formed over the first interlayer dielectric layer 16 including the first contact plug 17 that is embedded in the first interlayer dielectric layer 16. This anti-peeling-layer 18 is formed after the formation of the first contact plug 17 is completed but before a second contact plug 19 and a variable resistance pattern 23 on top of the second contact plug 19 are formed. The second contact plug 19 may be formed through the anti-peeling layer 18 and the first interlayer dielectric layer 16 in the first area 100 so as to electrically couple the landing plug contact 14 and the variable resistance pattern 23.

The variable resistance pattern 23 may be formed over the second contact plug 19 of the first area 100. The variable resistance pattern 23 may, in this particular examples shown in FIG. 1, have the same critical dimension (CD) as the second contact plug 19. Furthermore, a second interlayer dielectric layer 24 may be formed to fill the space between the variable resistance patterns 23. A conductive line 27 may be formed over the second interlayer dielectric layer 24 in the first area 100, and a metal wiring 28 may be formed over the second interlayer dielectric layer 24 in the second area 200. The first area 100 may include a third contact plug 25 which is formed through the second interlayer dielectric layer 24 so as to electrically couple the conductive line 27 and the variable resistance pattern 23, and the second area 200 may include a fourth contact plug 26 which is formed through the second interlayer dielectric layer 24 and the anti-peeling layer 18 so as to electrically couple the first contact plug 17 and the metal wiring 28.

In the present implementation in FIG. 1, the anti-peeling layer 18 may be formed between the first and second interlayer dielectric layers 16 and 24. The anti-peeling layer 18 may serve to prevent an attack, i.e., any significant adverse effect, on the first contact plug 17 when the second contact plug 19 is subsequently formed. In addition, the anti-peeling layer 18 may serve to prevent peeling when a variable resistance layer is deposited and patterned during a subsequent process for forming the variable resistance pattern 23. Thus, it is possible to prevent a particle source from being generated in the peripheral area, for example, the second area 200, due to peeling of the variable resistance layer. The anti-peeling layer 18 may include, for example, nitride, oxide, or silicon.

The anti-peeling layer 18 may be formed between the process for forming the first contact plug 17 and the subsequent process for forming the second contact plug 19. Thus, the first and second contact plugs 17 and 19 may have a level difference corresponding to the height of the anti-peeling layer 18.

The switching element 12 may serve to select a specific unit cell in a semiconductor device including a plurality of unit cells where each such unit cell is located in the first area 100. The switching element 12 may be disposed in each of the unit cells, and include a transistor, a diode and the like. In the present implementation in FIG. 1, the switching element may be formed in a buried gate type. In other implementations, the switching element is not limited to the buried gate type and may be formed in all types of suitable gate configurations. One end of the switching element may be electrically coupled to the second contact plug 19, and the other end of the switching element may be electrically coupled to a source line (not illustrated).

The etch stop layer 15 may serve to prevent damage to the semiconductor substrate 11, when the first and second contact plugs 17 and 19 are formed. The etch stop layer 15 may include a material having an etch selectivity with respect to the semiconductor substrate 11 and the first interlayer dielectric layer 16. The etch stop layer 15 may include, for example, nitride.

The first and second interlayer dielectric layers 16 and 24 may include an insulating material. For example, the first and second interlayer dielectric layers 16 and 24 may include an oxide.

The variable resistance pattern 23 may include a magnetic tunnel junction (MTJ) and layers disposed under and/or over the MTJ. The MTJ may include two magnetic layers 20 and 22 and a tunnel barrier layer 21 interposed therebetween, and the layers disposed under and/or over the MTJ may serve to improve the characteristic of the variable resistance element or facilitate the fabrication process.

The variable resistance pattern 23 may have a characteristic of switching between different resistance states according to the relative magnetization directions of the two magnetic layers 20 and 22. For example, when the magnetization directions of the two magnetic layers 20 and 22 are parallel to each other, the variable resistance pattern 23 may have a low resistance state, and when the magnetization directions of the two magnetic layers 20 and 22 are anti-parallel to each other, the variable resistance pattern 23 may have a high resistance state.

One of the first and second magnetic layers 20 and 22 may include a pinned ferromagnetic layer of which the magnetization direction is pinned, and the other may include a free ferromagnetic layer of which the magnetization direction is varied according to the direction of a current applied to the variable resistance pattern 23. The first and second magnetic layers 20 and 22 may include a ferromagnetic material. For example, the ferromagnetic material may have a single-layer or multilayer structure including Fe—Pt alloy, Fe—Pd alloy, Co—Pd alloy, Co—Pt alloy, Fe—Ni—Pt alloy, Co—Fe—Pt alloy, Co—Ni—Pt alloy, Fe—Pd alloy, Co—Pd alloy, Co—Pt alloy, Fe—Ni—Pt alloy, Co—Fe—Pt alloy, Co—Ni—Pt alloy or the like, and may further include an impurity such as boron (B). However, the materials for the first and second magnetic layers 20 and 22 are not limited to the above mentioned materials and other ferromagnetic materials may also be used.

The tunnel barrier layer 21 may change the magnetization direction of the free ferromagnetic layer through tunneling of electrons. The tunnel barrier layer 21 may have a single-layer or multilayer structure including a dielectric material, for example, oxide such as $Al_2O_3$, MgO, CaO, SrO, TiO, VO, or NbO. The tunnel barrier layer 21 may also be implemented by other dialectic materials.

The first to fourth contact plugs 17, 19, 25, and 26, the conductive line 27, and the metal wiring 28 may include a semiconductor layer or metallic layer. The second contact plug 19 may serve as a bottom electrode contact (BEC) of the variable resistance pattern 23. The third contact plug 25 may serve as a top electrode contact (TEC) of the variable resistance pattern 23. FIG. 1 illustrates that the conductive line 27 and the metal wiring 28 are formed on the same line. However, depending on the process, the conductive line 27 and the metal wiring 28 may be formed with a level difference therebetween.

Figure 2:
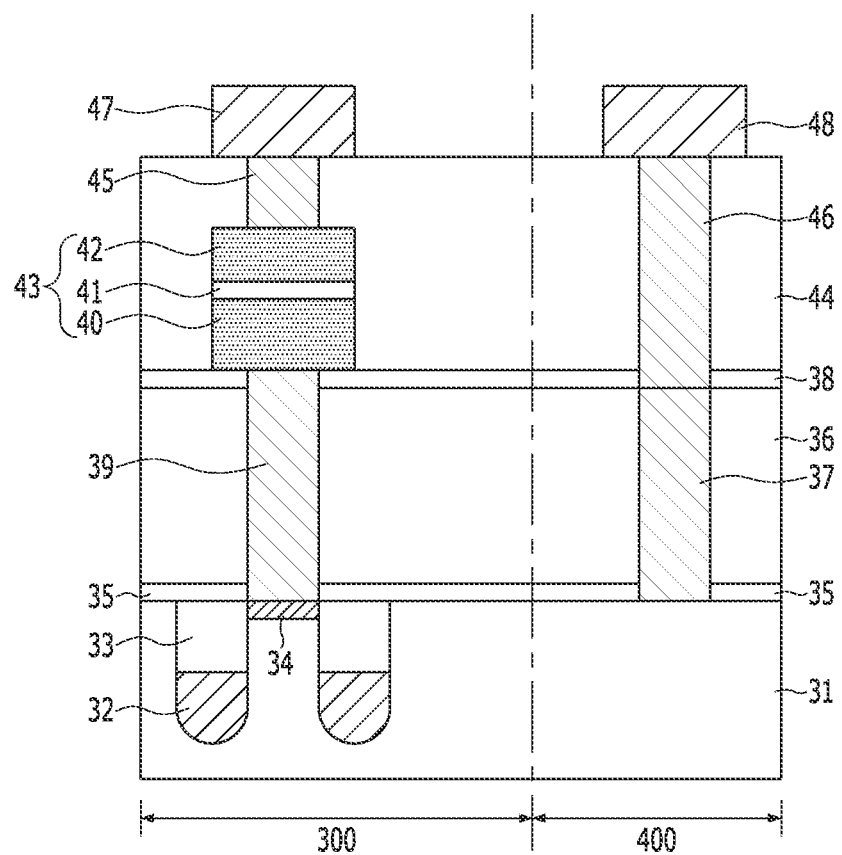
FIG. 2 is a cross-sectional view of a semiconductor device in accordance with another implementation.

FIG. 2 is a cross-sectional view of a semiconductor device in accordance with a second implementation.

As illustrated in FIG. 2, an isolation layer (not illustrated) may be formed in a semiconductor substrate 31 including first and second areas 300 and 400. The first area 300 may include a cell area, and the second area 400 may include a peripheral area. Furthermore, a switching element may be formed in the semiconductor substrate 31 of the first area 300. The switching element may include a gate electrode 32 and a sealing layer 33. Hereafter, the gate electrode 32 serving as a switching element may be referred to as a switching element 32. Between the switching elements 32, a landing plug contact 34 may be formed.

An etch stop layer 35 and a first interlayer dielectric layer 36 may be formed over the semiconductor substrate 31 including the switching elements 32 and the landing plug contact 34. Furthermore, a first contact plug 37 may be formed over the semiconductor substrate 31 of the second area 400. The first contact plug 37 may be coupled to the semiconductor substrate 31 through the first interlayer dielectric layer 36.

An anti-peeling layer 38 may be formed over the first interlayer dielectric layer 36 including the first contact plug 37. Furthermore, a second contact plug 39 may be formed through the anti-peeling layer 38 and the first interlayer dielectric layer 36 in the first area 300 so as to electrically couple the landing plug contact 34 and a variable resistance pattern 43.

The variable resistance pattern 43 may be formed over the second contact plug 39 and the anti-peeling layer 38 in the first area 300. Furthermore, a second interlayer dielectric layer 44 may be formed to fill the space between the variable resistance patterns 43. A conductive line 47 may be formed over the second interlayer dielectric layer 44 of the first area 300, and a metal wiring 48 may be formed over the second interlayer dielectric layer 44 of the second area 400. The first area 300 may include a third contact plug 45 which is formed through the second interlayer dielectric layer 44 so as to electrically couple the conductive line 47 and the variable resistance pattern 43, and the second area 400 may include a fourth contact plug 46 which is formed through the second interlayer dielectric layer 44 and the anti-peeling layer 38 so as to electrically couple the first contact plug 37 and the metal wiring 48.

In the present implementation in FIG. 2, the anti-peeling layer 38 may be formed between the first and second interlayer dielectric layers 36 and 44. The anti-peeling layer 38 may serve to prevent an attack, i.e., any significant adverse effect, on the first contact plug 37 when the second contact plug 39 is subsequently formed. In addition, the anti-peeling layer 38 may serve to prevent peeling when a variable resistance layer is deposited and patterned during a subsequent process for forming the variable resistance pattern 43. Thus, it is possible to prevent a particle source from being generated in the peripheral area, for example, the second area 400, due to peeling of the variable resistance layer. In the specific configuration in FIG. 2, the variable resistance pattern 43 is shown to have a larger CD than the second contact plug 39 and is formed in the first area 300. The adhesion of the variable resistance pattern 43 to the lower layer may be improved due to the larger CD of the variable resistance pattern 43. The anti-peeling layer 38 may include, for example, nitride, oxide, or silicon.

The anti-peeling layer 38 may be formed between the process for forming the first contact plug 37 and the process for forming the second contact plug 39. Thus, the first and second contact plugs 37 and 39 may have a level difference corresponding to the height of the anti-peeling layer 38.

Figure 3:
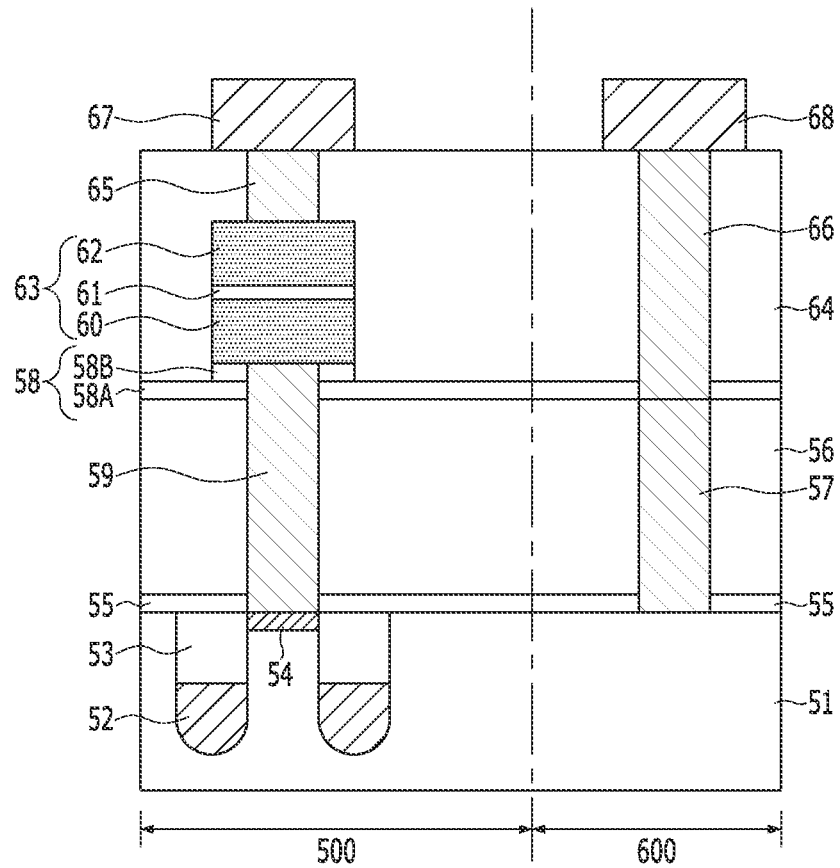
FIG. 3 is a cross-sectional view of a semiconductor device in accordance with another implementation.

FIG. 3 is a cross-sectional view of a semiconductor device in accordance with a third implementation.

As illustrated in FIG. 3, an isolation layer (not illustrated) may be formed in a semiconductor substrate 51 including first and second areas 500 and 600. The first area 500 may include a cell area, and the second area 600 may include a peripheral area. Furthermore, a switching element may be formed in the semiconductor substrate 51 of the first area 500. The switching element may include a gate electrode 52 and a sealing layer 53. Hereafter, the gate electrode 52 serving as a switching element may be referred to as a switching element 52. Between the switching elements 52, a landing plug contact 54 may be formed.

An etch stop layer 55 and a first interlayer dielectric layer 56 may be formed over the semiconductor substrate 51 including the switching elements 52 and the landing plug contact 54. Furthermore, a first contact plug 57 may be formed over the semiconductor substrate 51 of the second area 600. The first contact plug 57 may be coupled to the semiconductor substrate 51 through the first interlayer dielectric layer 56.

An anti-peeling layer 58 may be formed over the first interlayer dielectric layer 56 including the first contact plug 57. Furthermore, a second contact plug 59 may be formed through the anti-peeling layer 58 and the first interlayer dielectric layer 56 in the first area 500 so as to electrically couple the landing plug contact 54 and a variable resistance pattern 63.

The variable resistance pattern 63 may be formed over the anti-peeling layer 58 of the first area 500. Furthermore, a second interlayer dielectric layer 64 may be formed to fill the space between the variable resistance patterns 63. A conductive line 67 may be formed over the second interlayer dielectric layer 64 of the first area 500, and a metal wiring 68 may be formed over the second interlayer dielectric layer 64 of the second area 600. The first area 500 may include a third contact plug 65 which formed through the second interlayer dielectric layer 64 so as to electrically couple the conductive line 67 and the variable resistance pattern 63, and the second area 600 may include a fourth contact plug 66 which is formed through the second interlayer dielectric layer 64 and the anti-peeling layer 58 so as to electrically couple the first contact plug 57 and the metal wiring 68.

In the present implementation, the anti-peeling layer 58 may be formed between the first and second interlayer dielectric layers 56 and 64. The anti-peeling layer 58 may serve to prevent an attack on the first contact plug 57 when the second contact plug 59 is subsequently formed. In addition, the anti-peeling layer 58 may serve to prevent peeling when a variable resistance layer is deposited and patterned during a subsequent process forming the variable resistance pattern 63. Thus, it is possible to prevent a particle source from being generated in the peripheral area, for example, the second area 600, due to peeling of the variable resistance layer. The anti-peeling layer 58 may have a single-layer or multilayer structure. The anti-peeling layer 58 having a multilayer structure may include a stacked structure of a passivation layer 58A and an adhesive layer 58B. The passivation layer 58A may include nitride, oxide, or a stacked structure thereof. The adhesive layer 58B may include, for example, silicon. The adhesive layer 58B may be etched when the variable resistance pattern 63 is formed, and the adhesive layer 58B after the etching process is an adhesive area left under the variable resistance pattern 63 to have the same CD as the variable resistance pattern 63. The adhesive layer 58B under the variable resistance pattern 63 may improve adhesion of the variable resistance pattern 63 to the lower layer.

The anti-peeling layer 58 may be formed between the process for forming the first contact plug 57 and the process for forming the second contact plug 59. Thus, the first and second contact plugs 57 and 59 may have a level difference corresponding to the height of the anti-peeling layer 58.

FIGS. 4A to 4F are cross-sectional views for explaining a method for fabricating the semiconductor device. For example, FIGS. 4A to 4F are cross-sectional views illustrating a method for fabricating the semiconductor device of FIG. 3. In FIGS. 4A to 4F, the same reference numerals are used as those of FIG. 3 to identify same or similar elements.

Figure 4A:
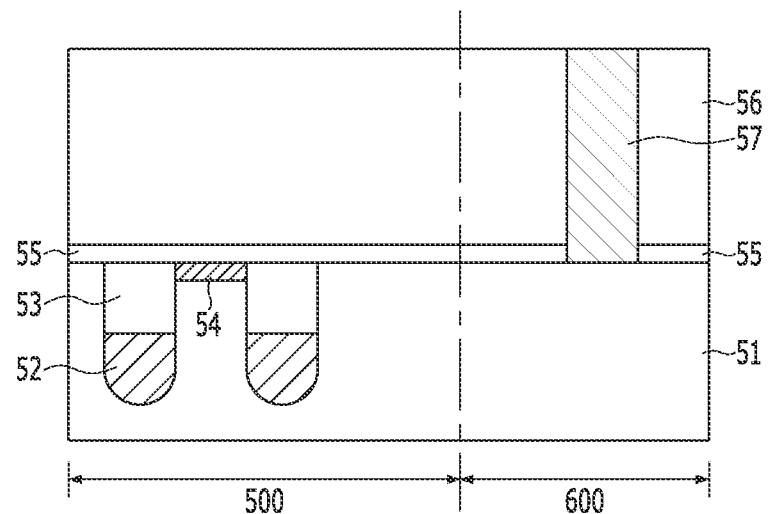
FIGS. 4A to 4F are cross-sectional views for explaining a method for fabricating the semiconductor device.

As illustrated in FIG. 4A, a switching element 52 may be formed in a first area 500 of a semiconductor substrate 51 which includes the first area 500 and a second area 600. The first area 500 may include a cell area, and the second area 600 may include a peripheral area.

The switching element 52 may be formed in a buried gate type. The switching element 52 may include a stacked structure of a buried gate electrode 52 and a sealing layer 53.

Between the switching elements 52, a landing plug contact 54 may be formed. The landing plug contact 54 may include a metallic layer. The metallic layer may include a conductive layer containing a metal element, and include a metal, metal oxide, metal nitride, metal oxynitride, metal silicide or the like. For example, the landing plug contact 54 may include titanium nitride (TiN).

An etch stop layer 55 may be formed over the semiconductor substrate 51 including the switching element 52. The etch stop layer 55 may serve to prevent damage to the semiconductor substrate 51 when a first contact plug 57 and a second contact plug are formed. The etch stop layer 55 may include a material having an etch selectivity with respect to a first interlayer dielectric layer 56 and the semiconductor substrate 51. The etch stop layer 55 may include, for example, nitride.

The first interlayer dielectric layer 56 may be formed over the etch stop layer 55. The first interlayer dielectric layer 56 may include a material having an etch selectivity with respect to the etch stop layer 55. For example, the first interlayer dielectric layer 56 may include oxide or oxynitride. The first interlayer dielectric layer 56 may have a single-layer or multilayer structure.

Next, the first contact plug 57 may be formed in the second area 600 before forming the second contact plug 59 for providing electrical contact to the variable resistance pattern 63. The first contact plug 57 is coupled to the semiconductor substrate 51 through the first interlayer dielectric layer 56 and the etch stop layer 55 of the second area 600. The first contact plug 57 may be formed through a series of processes. For example, such processes may include a process of forming a contact hole to expose the semiconductor substrate 51 through the first interlayer dielectric layer 56 and the etch stop layer 55, a process of forming a conductive material on the entire surface of the resultant structure so as to gap-fill the contact hole, or a process of electrically isolating the first contact plugs 57 adjacent to each other. The isolation process may be performed using an overall etching process (for example, etch-back) or chemical mechanical polishing process. More specifically, the isolation process may be performed by etching or polishing the conductive material formed on the entire surface of the resultant structure until the first interlayer dielectric layer 56 is exposed.

Figure 4B:
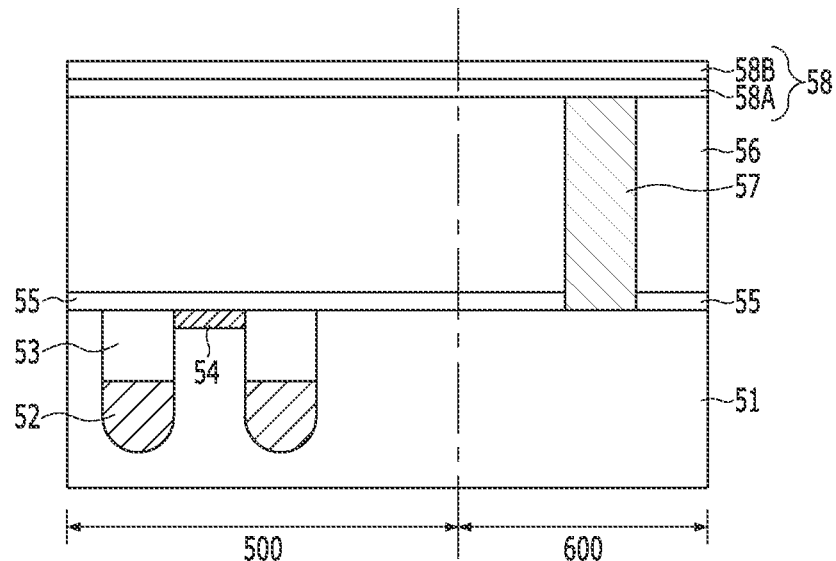

As illustrated in FIG. 4B, an anti-peeling layer 58 may be formed over the first interlayer dielectric layer 56 including the first contact plug 57 that is embedded in the first interlayer dielectric layer 56. The anti-peeling layer 58 may serve to prevent damage to the first contact plug 57 when the second contact plug 59 is subsequently formed. In addition, the anti-peeling layer 58 may serve to prevent peeling of a variable resistance layer that is formed at a later stage.

The anti-peeling layer 58 may include a stacked structure of a passivation layer 58A and an adhesive layer 58B. The passivation layer 58A may include an insulating material, and the adhesive layer 58B may include silicon. For example, the passivation layer 58A may include oxide, nitride, or a stacked structure thereof. FIG. 4B illustrates that the anti-peeling layer 58 includes the stacked structure of the passivation layer 58A and the adhesive layer 58B. However, other implementations are also possible on the structure of the anti-peeling layer 58. For example, as illustrated in FIG. 1 or 2, the anti-peeling layer 58 may have a single-layer structure.

The thickness of the anti-peeling layer 58 may be adjusted in consideration of various factors. For example, a loss caused during a subsequent process including a polishing process for forming the second contact plug or an etching process for forming a variable resistance pattern can be considered. For example, the anti-peeling layer 58 may have a thickness of 100 Å or less.

Figure 4C:
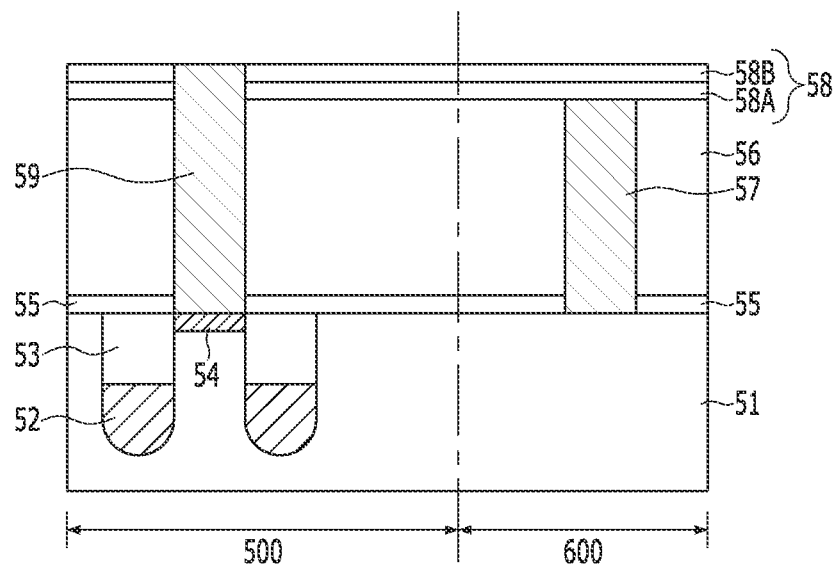

As illustrated in FIG. 4C, the second contact plug 59 may be formed in the first area 500 to pass through the anti-peeling layer 58, the first interlayer dielectric layer 56, and the etch stop layer 55.

The second contact plug 59 may be formed through a series of processes. First, a contact hole is formed to expose the landing plug contact 54 passing through the anti-peeling layer 58, the first interlayer dielectric layer 56, and the etch stop layer 55. Next, a conductive material is formed on the entire surface of the resultant structure so as to gap-fill the contact hole. Then, the second contact plugs 59 adjacent to each other are electrically isolated. The isolation process may be performed through an overall etching process (for example, etch-back) or chemical mechanical polishing process. More specifically, the isolation process may be performed by etching or polishing the conductive material formed on the entire surface of the resultant structure until the anti-peeling layer 58 is exposed.

Due to presence of the anti-peeling layer 58, at this stage of forming the second contact plug 59, the first contact plug 57 of the second area 600 is covered by the anti-peeling layer 58 and is not directly exposed to the processes in forming the second contact plug 59 including, e.g., the polishing process during formation of the second contact plug 59. Therefore, the first contact plug 57 is insulated from the adverse effects or damage that may cause by the formation of the second contact plug 59 and thus is protected.

Figure 4D:
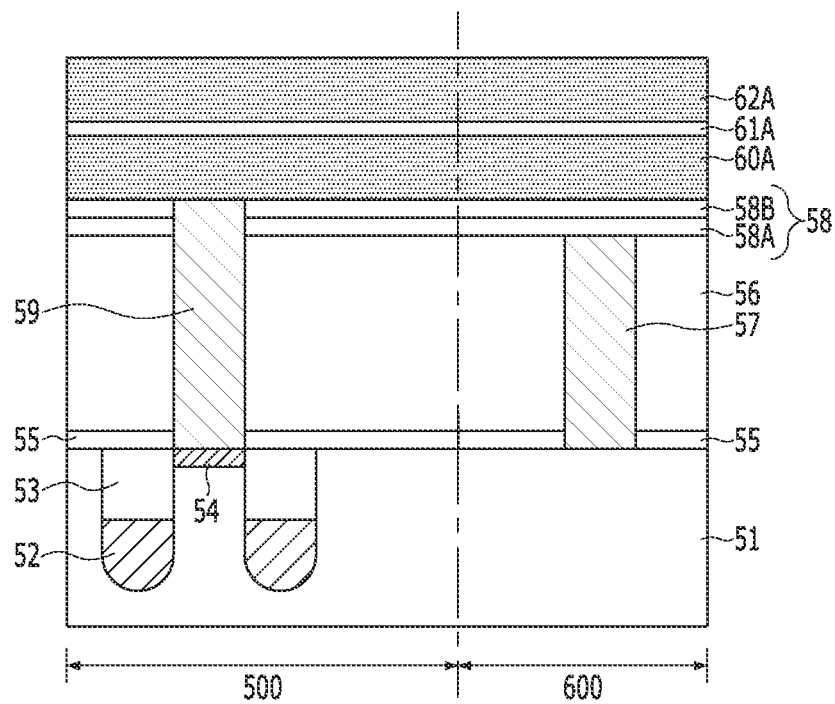

As illustrated in FIG. 4D, layers for forming a variable resistance element such as layers 60A, 61A and 62A may be formed over the anti-peeling layer 58 including the second contact plug 59 embedded in the dielectric layer 56 and penetrating through the anti-peeling layer 58 while the first contact plug 57 is underneath and covered by the first contact plug 57. The variable resistance element layers 60A, 61A and 62A may have a stacked structure of ferromagnetic materials for forming magnetic layers 60A and 62A and an insulating material for forming a tunnel barrier layer 61A between the layers 60A and 62A. Furthermore, conductive materials (not illustrated) for forming electrodes may be formed over and under the ferromagnetic materials 60A and 62A.

Under this configuration, the anti-peeling layer 58 may improve adhesion to the variable resistance layer so as to prevent peeling in the second area 600. Thus, it is possible to prevent a defect caused by lifting or the like. Furthermore, when the adhesive layer 58B is formed of amorphous silicon, the adhesive layer 58B has no or little significant influence on crystallization when the variable resistance layer is formed. Thus, the adhesion may be improved without changing the characteristic or resistance of the variable resistance layer.

Figure 4E:
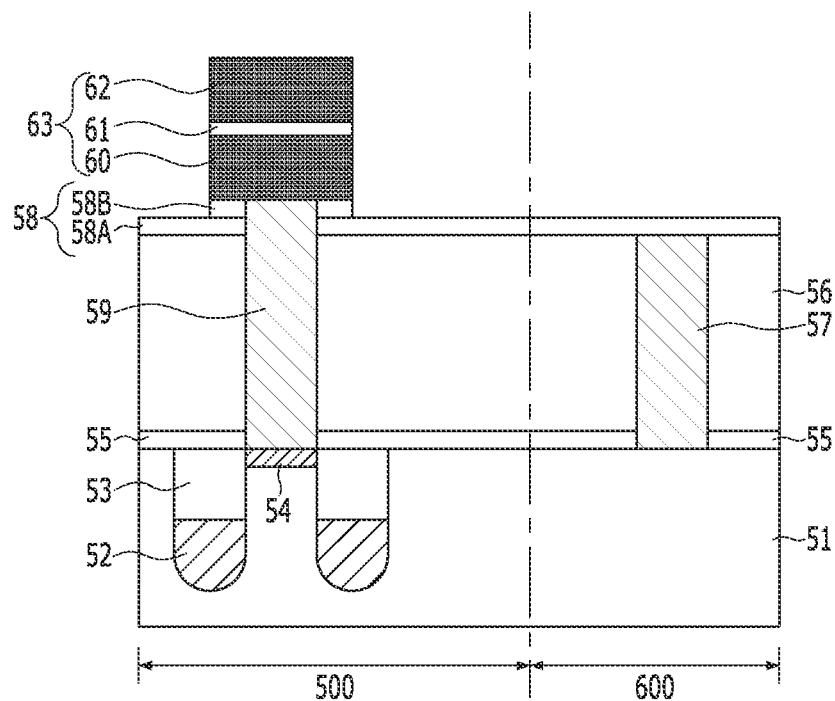

As illustrated in FIG. 4E, the variable resistance layer may be etched to form a variable resistance pattern 63 in the first area 500 while the portion of the variable resistance layer above the anti-peeling layer 58 in the area 600 is removed. The variable resistance pattern 63 may have a stacked structure of a first magnetic layer 60, a tunnel barrier layer 61, and a second magnetic layer 62. Furthermore, a spacer (not illustrated) may be formed on the sidewalls of the variable resistance pattern 63. Furthermore, a first electrode (not illustrated) may be formed under the first magnetic layer 60, and a second electrode (not illustrated) may be formed over the second magnetic layer 62. In addition, a template layer, a coupling layer, and an interface layer may be formed to improve the characteristics of the respective magnetic layers.

During the etching process for forming the variable resistance pattern 63, the adhesive layer 58B of the anti-peeling layer 58 may be etched together. Thus, the adhesive layer 58B may be remained under the variable resistance pattern 63, while having the same CD as the variable resistance pattern 63. While the adhesive layer 58B is etched, the adhesive layer 58B may be re-deposited on the sidewalls of the variable resistance pattern 63. However, when the adhesive layer 58B is formed of silicon, an oxidation process may be selectively performed. Since the sidewalls are insulated through the selective oxidation process, the adhesive layer 58B may have no influence on the device characteristic.

In the present implementation as illustrated in FIGS. 4A-4F, since the first contact plug 57 is not exposed through the anti-peeling layer 58 when both the second contact plug 59 is formed after the formation of the first contact plug 57 and the variable resistance pattern 63 is formed after formation of the second contact plug 59, the first contact plug 57 is protected by the anti-peeling layer 58 against adverse effects in forming the second contact plug 59 and the variable resistance pattern 63 without being subject to any significant damage. Furthermore, the passivation layer 58A may be remained due to etch selectivity, thereby preventing the exposure and damage of the first interlayer dielectric layer 56.

Figure 4F:
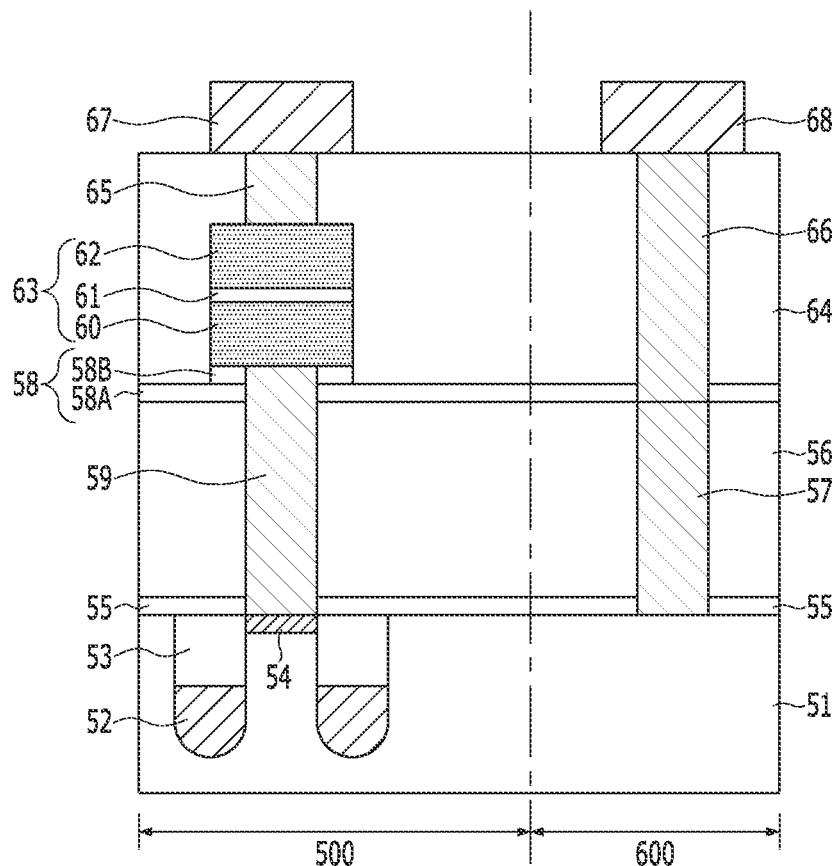

As illustrated in FIG. 4F, a second interlayer dielectric layer 64 may be formed over the anti-peeling layer 58. The second interlayer dielectric layer 64 may be formed to a thickness enough to fill the space between the variable resistance patterns 63. For example, the top surface of the second interlayer dielectric layer 64 may be higher than the top surface of the variable resistance pattern 63. The second interlayer dielectric layer 64 may be formed of the same material as the first interlayer dielectric layer 56. The second interlayer dielectric layer 64 may include oxide, nitride, oxynitride, or a stacked structure thereof.

Then, a third contact plug 65 may be formed to be coupled to the variable resistance pattern 63 through the second interlayer dielectric layer 64 of the first area 500. The third contact plug 65 may be formed through a series of processes. For example, such processes may include a process of forming a contact hole through a part of the second interlayer dielectric layer 64 so as to expose the top of the variable resistance pattern, a process of forming a conductive material on the entire surface of the resultant structure so as to gap-fill the contact hole, or a process of electrically isolating the third contact plugs 65 adjacent to each other. The third contact plug 65 may serve to electrically couple the conductive line 67 and the variable resistance pattern 63. Further, the third contact plug 65 may serve as an electrode for the variable resistance pattern 63, for example, a top electrode contact (TEC).

Then, a fourth contact plug 66 may be formed to be coupled to the first contact plug 57 through the second interlayer dielectric layer 64 and the anti-peeling layer 58 in the second area 600. The fourth contact plug 66 may be formed through a series of processes of forming a contact hole through the second interlayer dielectric layer 64 and the anti-peeling layer 58 so as to expose the first contact plug 57, forming a conductive material on the entire surface of the resultant structure so as to gap-fill the contact hole, and performing an isolation process of electrically isolating the fourth contact plugs 66 adjacent to each other.

Then, a conductive line 67 coupled to the third contact plug 65 of the first area 500 and a metal wiring 68 coupled to the fourth contact plug 66 of the second area 600 may be formed. The conductive line 67 and the metal wiring 68 may include a stacked structure of a barrier layer and a metallic layer.

In one implementation in FIG. 3, the conductive line 67 and the metal wiring 68 may be formed on the same line. However, other implementations are also possible. The conductive line 67 and the metal wiring 68 may have a level difference therebetween, and the fourth contact plug 66 and the metal wiring 68 may be formed after the conductive line 67 is formed.

In accordance with the above-described implementations, it is possible to prevent a defect of the variable resistance element and improve the characteristic of the variable resistance element.

The above and other memory circuits or semiconductor devices based on the disclosed technology can be used in a range of devices or systems. FIGS. 5-9 provide some examples of devices or systems that can implement the memory circuits disclosed herein.

Figure 5:
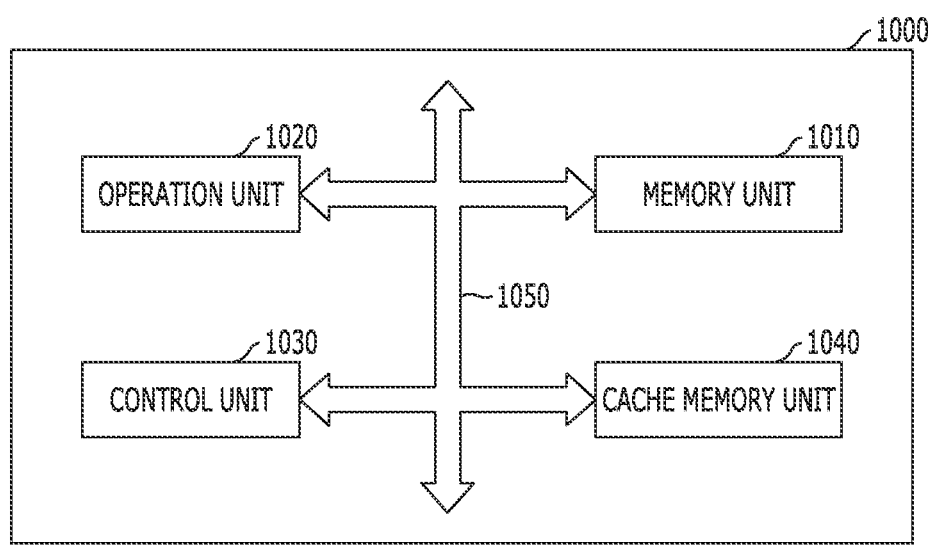
FIG. 5 is an example of configuration diagram of a microprocessor implementing memory circuitry based on the disclosed technology.

FIG. 5 is an example of configuration diagram of a microprocessor implementing memory circuitry based on the disclosed technology.

Referring to FIG. 5, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include an interlayer dielectric layer formed over a substrate including first and second areas; a first contact plug contacted with the substrate through the interlayer dielectric layer of the second area; an anti-peeling layer formed over the interlayer dielectric layer including the first contact plug; a second contact plug contacted with the substrate through the anti-peeling layer and the interlayer dielectric layer in the first area; and a variable resistance pattern contacted with the second contact plug. Through this, a fabrication process of the memory unit 1010 may be performed to improve the characteristic of the memory unit 1010. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 6:
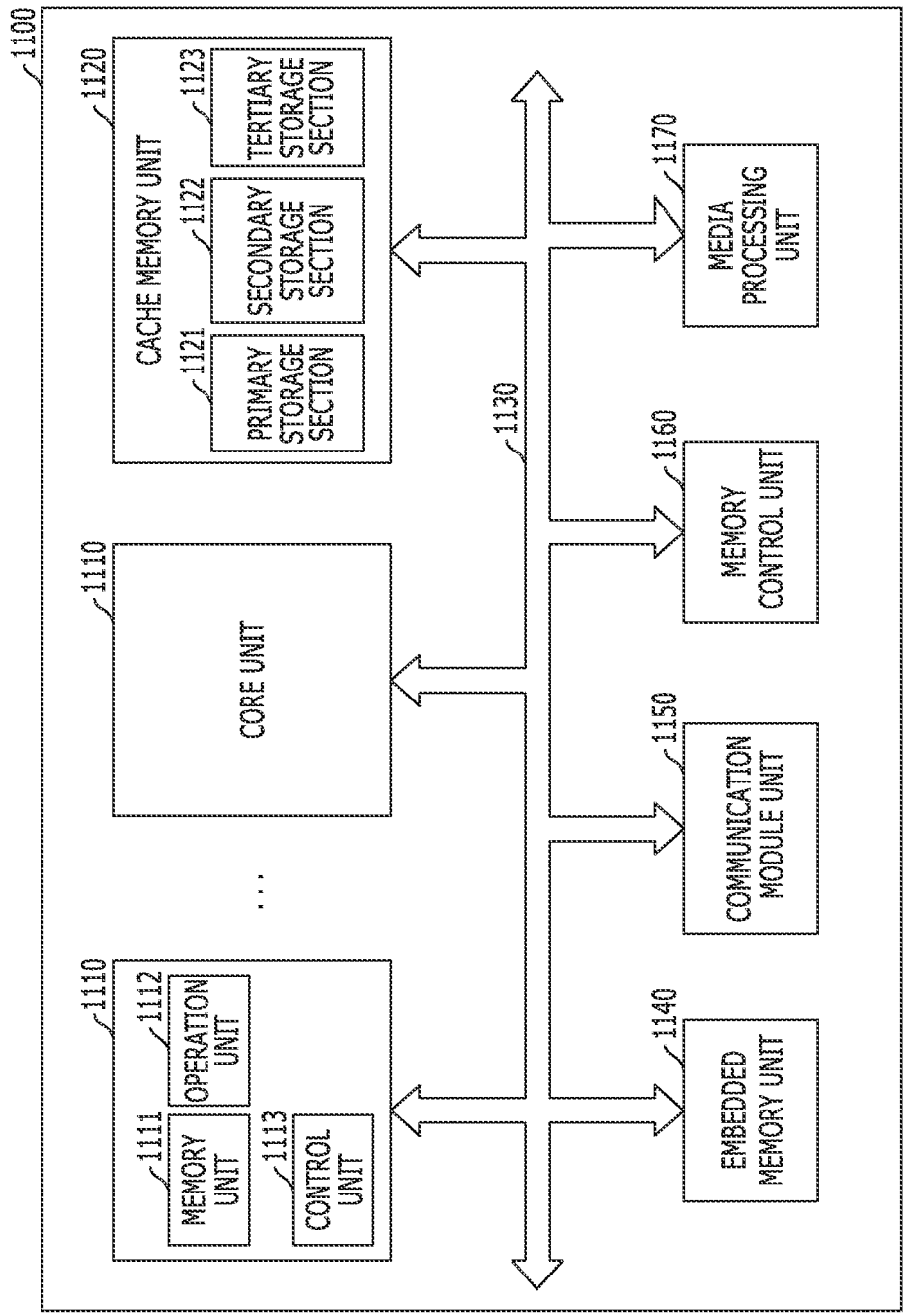
FIG. 6 is an example of configuration diagram of a processor implementing memory circuitry based on the disclosed technology.

FIG. 6 is an example of configuration diagram of a processor implementing memory circuitry based on the disclosed technology.

Referring to FIG. 6, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include an interlayer dielectric layer formed over a substrate including first and second areas; a first contact plug contacted with the substrate through the interlayer dielectric layer of the second area; an anti-peeling layer formed over the interlayer dielectric layer including the first contact plug; a second contact plug contacted with the substrate through the anti-peeling layer and the interlayer dielectric layer in the first area; and a variable resistance pattern contacted with the second contact plug. Through this, a fabrication process of the cache memory unit 1120 may be performed to improve the characteristic of the cache memory unit 1120. As a consequence, operating characteristics of the processor 1100 may be improved.

Although it was shown in FIG. 6 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 7:
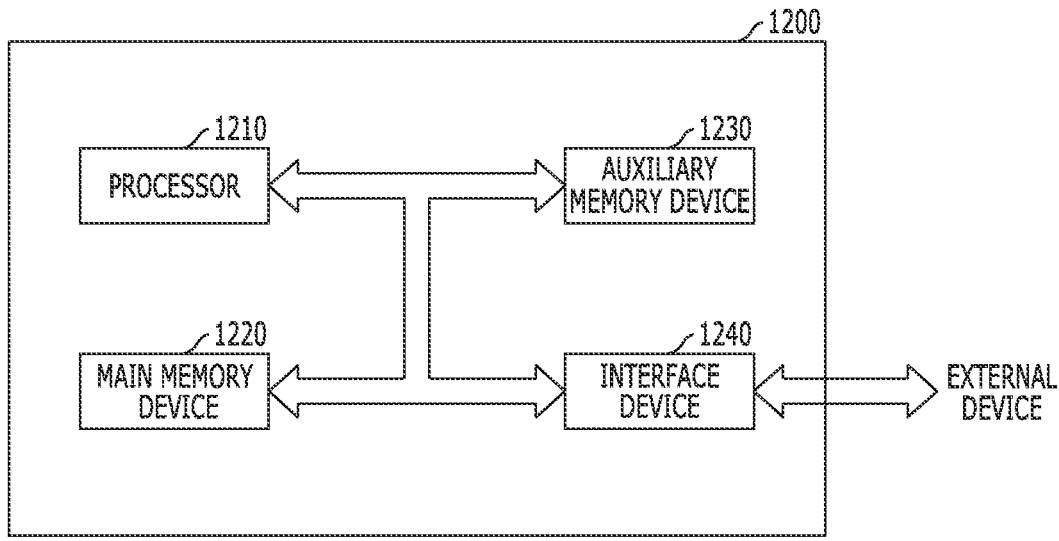
FIG. 7 is an example of configuration diagram of a system implementing memory circuitry based on the disclosed technology.

FIG. 7 is an example of configuration diagram of a system implementing memory circuitry based on the disclosed technology.

Referring to FIG. 7, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include an interlayer dielectric layer formed over a substrate including first and second areas; a first contact plug contacted with the substrate through the interlayer dielectric layer of the second area; an anti-peeling layer formed over the interlayer dielectric layer including the first contact plug; a second contact plug contacted with the substrate through the anti-peeling layer and the interlayer dielectric layer in the first area; and a variable resistance pattern contacted with the second contact plug. Through this, a fabrication process of the main memory device 1220 may be performed to improve the characteristic of the main memory device 1220. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include an interlayer dielectric layer formed over a substrate including first and second areas; a first contact plug contacted with the substrate through the interlayer dielectric layer of the second area; an anti-peeling layer formed over the interlayer dielectric layer including the first contact plug; a second contact plug contacted with the substrate through the anti-peeling layer and the interlayer dielectric layer in the first area; and a variable resistance pattern contacted with the second contact plug. Through this, a fabrication process of the auxiliary memory device 1230 may be performed to improve the characteristic of the auxiliary memory device 1230. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 8:
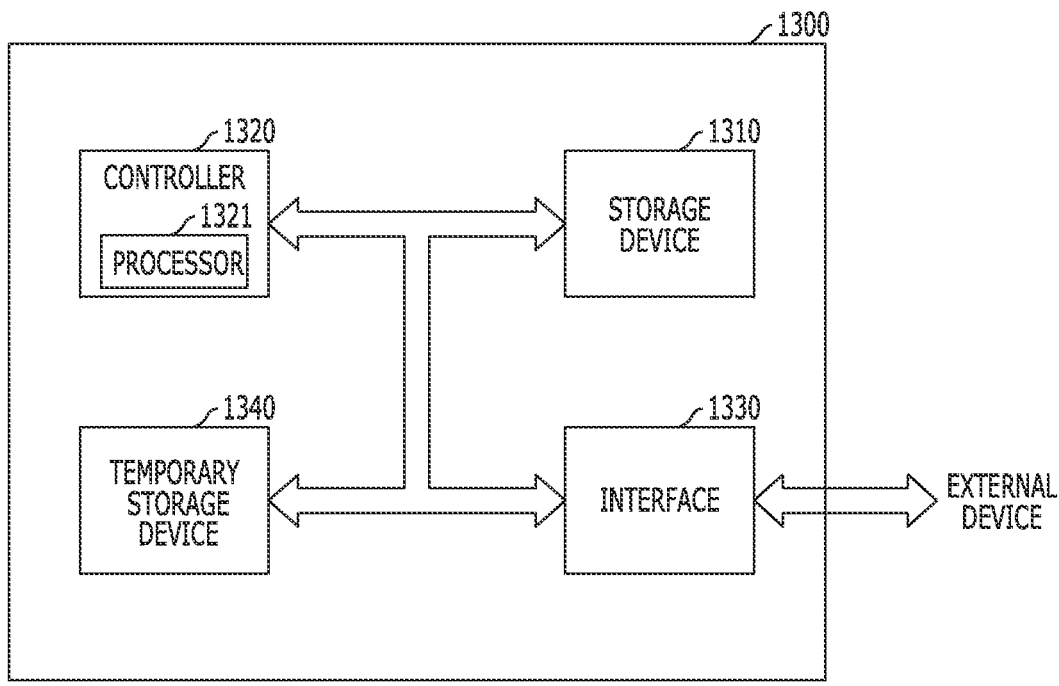
FIG. 8 is an example of configuration diagram of a data storage system implementing memory circuitry based on the disclosed technology.

FIG. 8 is an example of configuration diagram of a data storage system implementing memory circuitry based on the disclosed technology.

Referring to FIG. 8, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include an interlayer dielectric layer formed over a substrate including first and second areas; a first contact plug contacted with the substrate through the interlayer dielectric layer of the second area; an anti-peeling layer formed over the interlayer dielectric layer including the first contact plug; a second contact plug contacted with the substrate through the anti-peeling layer and the interlayer dielectric layer in the first area; and a variable resistance pattern contacted with the second contact plug. Through this, a fabrication process of the storage device 1310 or the temporary storage device 1340 may be performed to improve the characteristic of the storage device 1310 or the temporary storage device 1340. As a consequence, operating characteristics of the data storage system 1300 may be improved.

Figure 9:
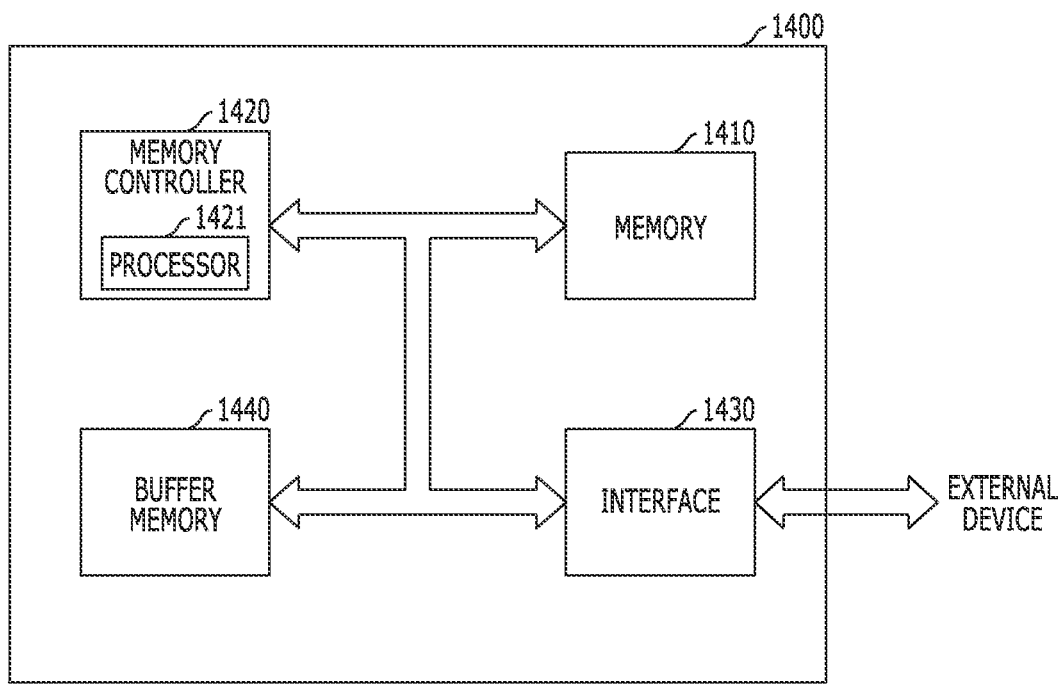
FIG. 9 is an example of configuration diagram of a memory system implementing memory circuitry based on the disclosed technology.

FIG. 9 is an example of configuration diagram of a memory system implementing memory circuitry based on the disclosed technology.

Referring to FIG. 9, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include an interlayer dielectric layer formed over a substrate including first and second areas; a first contact plug contacted with the substrate through the interlayer dielectric layer of the second area; an anti-peeling layer formed over the interlayer dielectric layer including the first contact plug; a second contact plug contacted with the substrate through the anti-peeling layer and the interlayer dielectric layer in the first area; and a variable resistance pattern contacted with the second contact plug. Through this, a fabrication process of the memory 1410 may be performed to improve the characteristic of the memory 1410. As a consequence, operating characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include an interlayer dielectric layer formed over a substrate including first and second areas; a first contact plug contacted with the substrate through the interlayer dielectric layer of the second area; an anti-peeling layer formed over the interlayer dielectric layer including the first contact plug; a second contact plug contacted with the substrate through the anti-peeling layer and the interlayer dielectric layer in the first area; and a variable resistance pattern contacted with the second contact plug. Through this, a fabrication process of the buffer memory may be performed to improve the characteristic of the buffer memory. As a consequence, operating characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 5-9 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory,
   wherein the semiconductor memory comprises:
   an interlayer dielectric layer formed over a substrate including first and second areas;
   a first contact plug formed over the substrate to pass through the interlayer dielectric layer of the second area;
   an anti-peeling layer formed over the interlayer dielectric layer including the first contact plug to cover the first contact plug;
   a second contact plug formed over the substrate to pass through the anti-peeling layer and the interlayer dielectric layer in the first area; and
   a variable resistance pattern contacted with and formed over the second contact plug and above the anti-peeling layer.

2. The electronic device of claim 1, wherein a portion of the variable resistance pattern is formed over the anti-peeling layer.

3. The electronic device of claim 1, wherein the anti-peeling layer includes a stacked structure of a passivation layer and an adhesive layer.

4. The electronic device of claim 3, wherein the adhesive layer is formed around a top end of the second contact plug.

5. The electronic device of claim 3, wherein the passivation layer includes an insulating material.

6. The electronic device of claim 3, wherein the adhesive layer includes silicon.

7. The electronic device of claim 1, wherein a top surface of the second contact plug is higher than a top surface of the first contact plug.

8. The electronic device of claim 1, further including:
   a third contact plug formed over the variable resistance pattern of the first area; and
   a conductive line formed over the third contact plug and coupled to the variable resistance pattern through the third contact plug.

9. The electronic device of claim 1, further comprising:
   a metal wiring of the second area; and
   a fourth contact plug for coupling the metal wiring to the first contact plug.

10. The electronic device according to claim 1, further comprising a microprocessor which includes:
    a control unit configured to receive a signal including a command from an outside of the microprocessor, and performs extracting, decoding of the command, or controlling input or output of a signal of the microprocessor;
    an operation unit configured to perform an operation based on a result that the control unit decodes the command; and a memory unit configured to store data for performing the operation, data corresponding to a result of performing the operation, or an address of data for which the operation is performed, wherein the semiconductor memory unit is part of the memory unit in the microprocessor.

11. The electronic device according to claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory unit is part of the cache memory unit in the processor.

12. The electronic device according to claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the semiconductor memory unit is part of the auxiliary memory device or the main memory device in the processing system.

13. The electronic device according to claim 1, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory unit is part of the storage device or the temporary storage device in the data storage system.

14. The electronic device according to claim 1, further comprising a memory system which includes:
a memory configured to store data and conserve stored data regardless of power supply;
a memory controller configured to control input and output of data to and from the memory according to a command inputted form an outside;
a buffer memory configured to buffer data exchanged between the memory and the outside; and
an interface configured to perform communication between at least one of the memory, the memory controller and the buffer memory and the outside,
wherein the semiconductor memory unit is part of the memory or the buffer memory in the memory system.

15. An electronic device comprising a semiconductor memory which includes,
a substrate including a first area and a second area;
a first contact plug and a second contact plug formed over the substrate of the second area and the first area, respectively;
a variable resistance pattern formed over the second contact plug and in electrical contact with the second contact plug; and
an anti-peeling layer formed to extend in both the first and second area to be above the first contact plug and below the variable resistance pattern and includes an opening through which the second contact plug passes through to reach the variable resistance pattern above the anti-peeling layer, wherein the anti-peeling layer isolates the first contact plug from layers formed above the anti-peeling layer and from fabrication processes performed after formation of the anti-peeling layer.

16. The electronic device of claim 15, wherein a top surface of the second contact plug is higher than a top surface of the first contact plug.

17. The electronic device of claim 15, the anti-peeling layer includes nitride, oxide, or silicon.

18. The electronic device of claim 15, wherein the anti-peeling layer includes a stacked structure of a passivation layer and an adhesive layer.

19. A method for fabricating an electronic device including a semiconductor memory, comprising:
forming a first interlayer dielectric layer over a substrate including first and second areas;
forming a first contact plug over the substrate to pass through the first interlayer dielectric layer of the second area;
forming an anti-peeling layer over the first interlayer dielectric layer including the first contact plug to cover the first contact plug;
after forming the anti-peeling layer covering the first contact plug, forming a second contact plug over the substrate to pass through the anti-peeling layer and the first interlayer dielectric layer in the first area; and
subsequently forming a variable resistance pattern over the second contact plug and above the anti-peeling layer.

20. The method of claim 19, wherein the forming of the variable resistance pattern includes:
forming a variable resistance layer over the anti-peeling layer including the second contact plug; and
etching the variable resistance layer so as to form the variable resistance pattern over the second contact plug while isolating the first contact plug that is covered by the anti-peeling layer from an impact of patterning the variable resistance layer.

* * * * *